(12) United States Patent
Chen et al.

(10) Patent No.: US 7,014,956 B2
(45) Date of Patent: Mar. 21, 2006

(54) ACTIVE SECONDARY EXPOSURE MASK TO MANUFACTURE INTEGRATED CIRCUITS

(75) Inventors: Fred Chen, Cupertino, CA (US); Jeff Farnsworth, Los Gatos, CA (US); Wen-hao Cheng, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 10/040,772

(22) Filed: Jan. 4, 2002

(65) Prior Publication Data

US 2003/0129502 A1    Jul. 10, 2003

(51) Int. Cl.
G03F 9/00    (2006.01)

(52) U.S. Cl. .......................................................... 430/5
(58) Field of Classification Search ..................... 430/5, 430/311, 322; 716/19
See application file for complete search history.

(56) References Cited

U.S. PATENT DOCUMENTS

| | | | | |
|---|---|---|---|---|
| 5,503,959 | A | | 4/1996 | Langston |
| 5,851,734 | A | * | 12/1998 | Pierrat ........................ 430/312 |
| 5,858,580 | A | | 1/1999 | Wang et al. |
| 5,995,912 | A | | 11/1999 | DeWolf et al. |
| 6,044,007 | A | * | 3/2000 | Capodieci .................. 365/120 |
| 6,071,658 | A | | 6/2000 | Wu et al. |
| 6,110,647 | A | * | 8/2000 | Inoue et al. ................ 430/312 |
| 6,120,952 | A | | 9/2000 | Pierrat et al. |
| 6,120,953 | A | | 9/2000 | Lin |
| 6,194,104 | B1 | | 2/2001 | Hsu |
| 6,218,057 | B1 | * | 4/2001 | Cirelli et al. .................. 430/5 |
| 6,218,089 | B1 | | 4/2001 | Pierrat et al. |
| 6,228,539 | B1 | | 5/2001 | Wang et al. |
| 6,383,719 | B1 | | 5/2002 | Bula et al. |
| 6,503,666 | B1 | | 1/2003 | Pierrat |
| 6,541,165 | B1 | * | 4/2003 | Pierrat ............................. 430/5 |
| 6,544,695 | B1 | * | 4/2003 | Wang et al. .................... 430/5 |
| 6,632,576 | B1 | | 10/2003 | Tejnil |
| 6,821,690 | B1 | * | 11/2004 | Bae ............................... 430/5 |

OTHER PUBLICATIONS

Warren Grobman and Yao–Ting Wang. Practical IC Design in the Subwavelength Regime. Web Page [online]. Integrated System Design Magazine. Posted Jan. 30, 2001. [Retrieved on May 25, 2001] Retrieved on the Internet: <URL: http://www.isdmag.com/story/OEG20010130S0098. pp. 1–8.

Integrated System Design Magazine isdmag.com. Figures 1–4. Web Page [online]. [Retrieved on May 25, 2001] Retrieved on the Internet: <URL: http://www.isdmag.com/editorial/2001/coverstoryfigures0102.html. pp. 1–4.

Dr. J. Tracy Weed and Dr. Linard Karklin. Dark–Field Double Exposure PSM Technique: A Manufacturing Approach to Phase Shifting. Semiconductors: SubMicron Focus: Double Exposure. Web Page [online]. Canon U.S.A. Inc. [Retrieved on May 29, 2001] Retrieved on the Internet: <URL: http://www.usa.canon.com/indtech/semicondeq/news_springs51_4.html. pp. 1–9.

(Continued)

Primary Examiner—S. Rosasco
(74) Attorney, Agent, or Firm—Blakely, Sokoloff, Taylor & Zafman LLP

(57) ABSTRACT

A mask having a pattern to modify a circuitry feature that has been exposed in a radiation sensitive layer by transmitting modifying radiation to a region of the radiation sensitive layer containing the exposed circuitry feature is described. The mask may reduce subwavelength distortions and proximity effect distortions of the exposed circuitry feature. The mask may be used to manufacture a semiconductor device having circuitry that is based on the modified circuitry feature.

19 Claims, 13 Drawing Sheets

OTHER PUBLICATIONS

Kenji Saitoh, Masanobu Hasegawa, Akiyoshi Suzuki and Minoru Yoshii. Ideal Way to Extend Optical Lithography. Semiconductors: SubMicron Focus: Aberrations. Web Page [online]. Canon U.S.A. Inc. [Retrieved on May 29, 2001] Retrieved on the Internet: <http://www.usa.canon.com/indetech/semicondeq/news_ideal.html. pp. 1–9.

Stan Chow, Andrew B. Kahng and Majid Sarrafzadeh. Modern Physical Design: Algorithm Technology Methodology (Part V). ICCAD Tutorial, Nov. 9, 2000. [online] [Retrieved on Jun. 22, 2001] Retrieved on the Internet: <URL: http://www.vlsicad.cs.ucla.edu/ICCAD00TUTORIAL/part5.pdf. pp. 1–44.

* cited by examiner

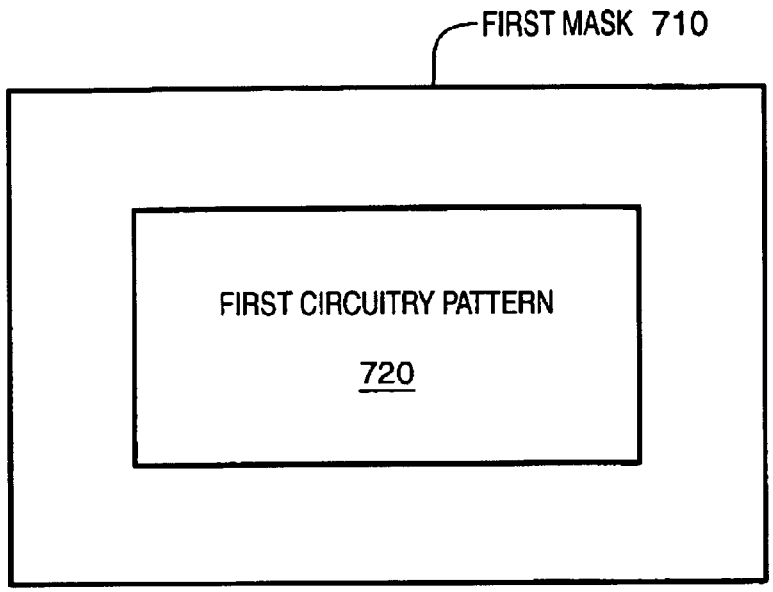
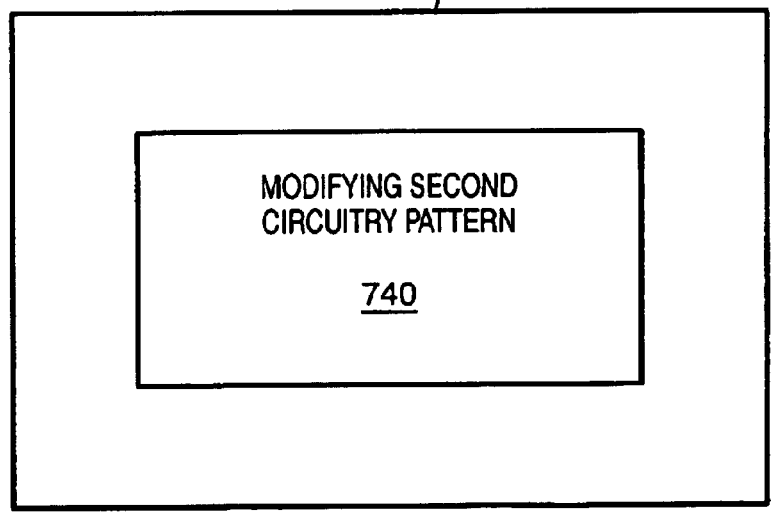
FIG. 7

ACTIVE SECONDARY EXPOSURE MASK TO MANUFACTURE INTEGRATED CIRCUITS

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software and data as described below and in the drawings hereto: Copyright © 2001, Intel Corporation, All Rights Reserved.

BACKGROUND OF THE INVENTION

1. Field of the Invention

The invention relates generally to manufacturing integrated circuits. More particularly, the invention relates to manufacturing integrated circuits by using an active second exposure mask having a pattern that modifies a previously exposed circuitry feature.

2. Background Information

Lithography is a step that is frequently used to manufacture semiconductor devices and integrated circuits (e.g., semiconductor logic products). During lithography a radiation sensitive layer or photoresist on a semiconductor device is selectively exposed to radiation through the use of a mask or reticle. Based on the exposure, select portions of a silicon wafer are exposed for subsequent processing associated with creating circuitry patterns.

FIG. 1 illustrates typical components of a lithography system 100. A radiation source 110 generates and transmits radiation 120 towards a radiation sensitive layer 160, through a mask 130 that contains a pattern 140. The mask 130 and the pattern 140 may have transparent regions that selectively transmit portions of the radiation 120 and opaque regions that selectively block portions of the radiation 120. Typically, the pattern 140 consists of alternating regions of opaque chrome on transparent quartz. The mask 130 and the pattern 140 selectively allow radiation 150 to expose a portion 170 of the radiation sensitive layer 160. After exposure conventional development processing may be used to remove a portion of the radiation sensitive layer 160. In a positive-development process the exposed portion 170 may be transformed so that it is comparatively easy to remove by development, while in a negative-development process the exposed portion 170 may be transformed so that it is comparatively difficult to remove. After development, conventional processing may be used to create circuitry related structures in the wafer 180.

The wavelength of the radiation 120, 150 affects the size of the circuitry that can be produced by lithography. Shorter wavelengths allow smaller features to be produced. Traditional wavelengths that have been used include 436 nm (called G-Line), 405 nm (H-line), 365 nm (I-line) and 248 nm (called Deep Ultraviolet), 193 nm, 157 nm, and others. The shorter wavelengths below about Deep Ultraviolet may typically result in a sub-wavelength condition, in which features to be created have smaller dimension than the wavelength of the radiation used to create them. This condition may introduce unintended and undesirable distortions and inaccuracies. For example, there may be optical proximity error that causes placement and fidelity of a first feature to be distorted by a neighboring feature.

FIG. 2 illustrates a mask 210 having a simple rectangular chrome pattern 220 having a width and a length. In a sub-wavelength condition, wherein at least one of these dimensions is shorter than a wavelength of radiation used to print or expose the pattern 220 into a radiation sensitive layer, the exposed pattern may have unintended and undesirable distortions and inaccuracies.

FIG. 3 illustrates a radiation sensitive layer 310 of a wafer (not shown) having an exposed feature 320 that differs from the pattern 220 due to subwavelength effects such as optical proximity error. In this case, since the pattern 220 was chrome, the exposed feature 320 is an unexposed region. A dashed line indicates an intended exposure feature 330 having dimensions substantially identical to the pattern 220. As shown, the actual exposed feature 320 differs from the intended exposure feature 330. In particular, a length of the exposed feature 320 is less than a length of the intended exposure feature 330. This represents line shortening. Additionally, the exposed feature 320 has rounded corners while the pattern 220 and the intended exposure feature 330 have squared corners. This represents corner rounding. These irregularities and inaccuracies can reduce the performance of circuits based on the feature 320 and/or cause them to fail.

FIG. 4 illustrates a mask 410 having an optical proximity corrective chrome pattern 420 that performs optical proximity correction (OPC) to the rectangular pattern 220 to reduce unintended irregularities and inaccuracies due to subwavelength effects like the optical proximity error. This may improve pattern fidelity by allowing an exposed feature generated from the pattern 420 to correspond more closely with an intended exposure feature. However, this approach offers a number of challenges. A first challenge is that the pattern 420 is complex and difficult to fabricate. A second challenge is that it becomes difficult to simultaneously provide such complex corrective features and simultaneously reduce feature dimensions, which may both be desired.

FIG. 5 illustrates a passive trim mask 510 having a protective chrome pattern 520. The passive trim mask 510 and the protective pattern 520 correspond to the mask 410 and are used to completely protect an exposed feature corresponding to the pattern 420 during a second exposure to radiation. The protective pattern 520 is larger than the pattern 420. Accordingly, the second exposure to radiation does not affect, modify, or alter a feature exposed in a radiation sensitive layer by a first exposure using the pattern 420.

BRIEF DESCRIPTION OF THE SEVERAL VIEWS OF THE DRAWINGS

The novel features believed characteristic of the invention are set forth in the appended claims. The present invention is illustrated by way of example, and not by way of limitation, in the figures of the accompanying drawings and in which like reference numerals refer to similar elements. The invention itself, however, as well as a preferred mode of use, will best be understood by reference to the following detailed description of an illustrative embodiment when read in conjunction with the accompanying drawings.

FIG. 7 shows a set of a first exposure mask to expose a circuitry pattern in a radiation sensitive layer and a second exposure mask to modify the circuitry pattern, according to one embodiment.

DETAILED DESCRIPTION OF THE INVENTION

In the following description, for the purpose of explanation, numerous specific details are set forth in order to provide a thorough understanding of the present invention. It will be apparent, however, to one having an ordinary level of skill in the art and the benefit of the present teachings that the present invention may be practiced without some of these specific details. In other instances, well-known structures and devices are shown in block diagram form.

Creating Semiconductor Device Using Modifying Secondary Exposure Mask

Figure 6:
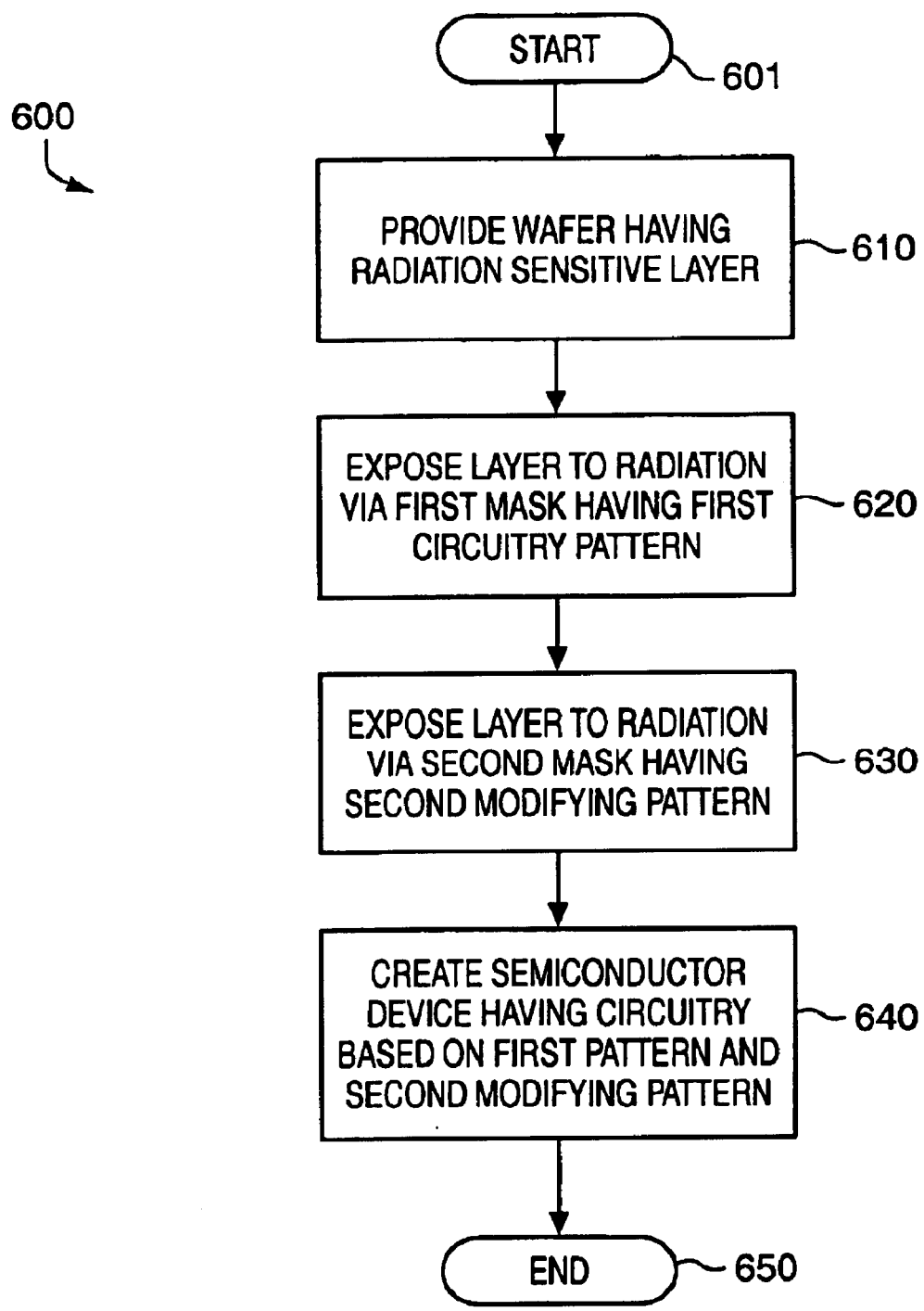
FIG. 6 shows a method for making a semiconductor device using an active second exposure mask, according to one embodiment.

FIG. 6 illustrates in block diagram form a method 600 for making a semiconductor device or integrated circuit using a first mask to expose a circuitry pattern and a second active mask to modify the exposed circuitry pattern. The terms "semiconductor device", "integrated circuit", and similar terms will be used to refer to any semiconductor product device, including but not limited to digital logic, digital memory, processors, microprocessors, coprocessors, and core logic chipsets. The semiconductor devices or integrated circuits may be semiconductor logic products that are object code compatible with semiconductor logic products of Intel Corporation of Santa Clara, Calif. The integrated circuit may have at least one circuit element that is created based on both a first approximation to a circuitry feature from a first mask and a refining modification to a size, a shape, or both a size and a shape of the first approximation from a second mask. The term "circuitry feature" will be used broadly to refer to at least a portion of a circuitry component that is associated with the first exposure and the second exposure. The term "circuit component" will be used broadly to refer to at least a circuitry portion of a semiconductor device, such as but not limited to conventional logic gates, circuit open or closing devices, transistors, resistors, capacitors, diodes, inductors, and other well-known components. Accordingly, considering in further detail a transistor, the circuitry feature may include a portion of the transistor, such as a gate, a base, a triggering line, a source, a drain, an emitter, a collector, and other portions. For example, one of a plurality of masking and exposure stages that may be used to crate a transistor circuit component may include exposing an approximation to a rectangular gate in a radiation sensitive layer with the first mask and reducing subwavelength distortions at the corners with a second exposure mask.

The method 600 commences at block 601, and then proceeds to block 610, where a wafer having a radiation sensitive layer is created, obtained, or otherwise provided. The term "radiation sensitive layer" will be used to refer to a substance deposited in a typically sufficiently uniform layer on top of a semiconductor device or wafer and that changes physically, chemically, or physico-chemically when exposed to radiation. Typically the change or transformation makes the layer comparably easy or difficult to remove. The layer may be a negative layer in which the radiation makes the layer comparably difficult to remove. For example, in the case of a polymeric material the radiation may encourage polymerization or cross-linking. Alternatively, the layer may be a positive layer in which the radiation makes the layer comparably easy to remove. For example, the radiation may cleave or otherwise compromise the structural integrity or chemical bonding of the layer.

The radiation sensitive layer and the radiation-induced change are to be interpreted broadly. Typically, the radiation sensitive layer may have an organic-based radiation sensitive substance. The radiation sensitive layer may be a conventional organic photoresist. The layer may be spin coated to a sufficiently uniform and predetermined layer thickness on the wafer that includes a layer of silicon dioxide ($SiO_2$) on a silicon base that has been cut from an ingot. Then the wafer having the radiation sensitive layer may be baked or otherwise processed to dry the layer, evaporate solvents, improve contact with the substrate, promote chemical reactions, or for other reasons.

The method 600 advances from block 610 to block 620 where the layer is exposed to radiation via a first mask having a first circuitry pattern to create an exposure image in the layer. The term mask will be used to broadly refer to a device containing pattern information associated with a process layer of a circuit associated with a semiconductor device or integrated circuit. The mask may have a number of materials including but not limited to glass, quartz, metal, chrome, plastic, film, and other materials desired for the particular implementation. The mask and the pattern may selectively transmit or block radiation incident to the mask. Although frequent reference will be made to a mask having radiation opaque chrome on transparent quartz other embodiments are contemplated.

The radiation sensitive layer may be placed so that the first mask is functionally disposed between the layer and a source of radiation. The source generates and transmits radiation toward the first mask. The term "radiation" will be used to refer to any radiation that is operable to chemically or physically transform the radiation sensitive layer. For example, the radiation may be electromagnetic radiation, ultraviolet light (e.g., having a wavelength 248 nm, 198 nm, or 157 nm), extreme ultraviolet light (e.g., having a wavelength between about 10–20 nm), x-rays, particle beams (e.g., electron beams), and other types of radiation.

The mask receives the incident radiation and transmits only a portion of the received incident radiation to the radiation sensitive layer based on the first circuitry pattern. The transmitted portion may include radiation to expose a first circuitry feature that at least approximates an intended exposed circuitry feature. For example, the transmitted portion may include radiation to expose an approximation to a rectangular gate circuitry feature that includes corner rounded exposure regions on each of the two long ends of the rectangle due to subwavelength distortions. The terms "exposed circuitry feature" and related terms will be used to include both exposed an unexposed circuitry features (e.g., an unexposed region defined by an exposed perimeter). The radiation sensitive layer receives the transmitted radiation portion and is chemically or physically transformed by the portion.

The method 600 advances from block 620 to block 630 where the layer is exposed to radiation via a second mask having a second modifying circuitry pattern to modify the exposure image already in the layer. Typically, the radiation source and the radiation described for block 620 may be used, although the invention is not so limited. The second mask receives the radiation and based on the modifying pattern transmits only a modifying portion of the received radiation to the radiation sensitive layer. The transmitted modifying portion includes radiation to modify the circuitry pattern exposed by the first mask. The portion may include radiation to modify a size, a shape, or both a size and a shape of the first exposed circuitry feature. For example, the modifying radiation may have radiation to modify the approximated rectangular gate circuitry feature by reducing the corner rounded exposure regions on each of the two long ends of the rectangle by providing subwavelength distortion reducing radiation portions to each of the distorted regions. The transmitted modifying portion may perform other functions such as performing other modifications to the first exposed circuitry pattern, performing other modifications to other circuitry features of the first exposed circuitry pattern, exposing de novo a circuitry feature, eliminating a false edge corresponding to the first exposed circuitry feature, and performing other desired exposures. The radiation sensitive layer receives the modifying portion including the radiation corresponding to the first circuitry feature and is chemically or physically transformed.

Although not shown explicitly in the method 600, additional exposures to additional masks are contemplated. For example, a third mask having a modifying pattern that modifies a circuitry feature of the first mask, the second mask, or both the first mask and the second mask, may be used. Additionally, as desired, a third mask may be used to trim unwanted exposure features outside of a circuitry feature region.

The method 600 advances from block 630 to block 640 where a semiconductor device or integrated circuit is created based on the first pattern and the second modifying pattern. The wafer and exposed radiation sensitive layer may be processed by conventional post-exposure manufacturing processes. The manufacturing process may use conventional methods, equipment, and materials. For example, the manufacturing process may include development, etching, doping, diffusion, dielectric deposition, metallization, passivation, electrical test, and assembly. The manufacturing process may also perform repeat exposure and post exposure processing.

The final semiconductor device may include a circuitry feature created by the first exposure and the modifying second exposure. For example, the device may have a gate feature created by an approximating exposure with the first mask and a refining exposure with the second mask that modifies the approximating exposure to reduce a corner rounding subwavelength distortion. The method 600 terminates at block 650.

Active Second Exposure Mask

FIG. 7 conceptually illustrates a set of exposure masks 700 that may be used to expose a radiation sensitive layer. The set 700 may be used in method 600 or in other methods.

The set 700 includes a first mask 710 having a first circuitry pattern 720 to expose a first circuitry pattern in a radiation sensitive layer and an active second mask 730 having a second modifying circuitry pattern 740 to expose a second circuitry pattern that modifies the first in the radiation sensitive layer. The first mask 710 and the pattern 720 may expose a circuitry feature into the radiation sensitive layer and the second mask 730 and the pattern 740 may modify a size, a shape, or both a size and a shape of the previously exposed circuitry feature by transmitting modifying radiation according to the pattern to a region of the radiation sensitive layer containing the circuitry feature.

Rather than the second mask 730 having a passive pattern to merely protect the previously exposed first circuitry pattern and trim or eliminate a false edge outside of a circuit feature region without modifying the circuit feature, the second mask 730 may have an active pattern 740 to play an active, participative role in modifying, reshaping, or resizing the circuitry feature. Advantageously, in this way the first mask 710 and the pattern 720 are not solely responsible for defining the size and/or the shape of a circuitry feature, and the second mask 730 and the modifying pattern 740 may assume some of the workload for defining the size and/or the shape of the circuitry feature.

Different modifications and modifying circuitry patterns 740 are contemplated. According to a first embodiment the modifying pattern 740 provides a performance enhancing modification to improve performance of a circuit component in a semiconductor device by resizing or reshaping a circuit feature.

According to a second embodiment, the modifying pattern 740 reduces a dimension of a circuitry feature previously exposed by the pattern 720. For example, the first mask 710 may create a linewidth and the second mask 730 may shrink the linewidth. Advantageously, in this way the first mask 710 and the second mask 730 may be able to concertedly produce a feature having a smaller dimension than can be accomplished by mask 710 alone.

According to a third embodiment, the modifying pattern 740 may have a subwavelength distortion reducing pattern to reduce a predictable subwavelength distortion and improve fidelity with respect to an intended circuitry feature. The subwavelength distortion may arise during exposure of the radiation sensitive layer to a first pattern 720 that includes a feature having a size that is small relative to a wavelength of radiation used to expose the feature. This condition may lead to a number of well-known distortions.

Proximity effect is one distortion that may lead to loss of resolution due to diffraction or scattering of radiation by other proximate structures. Radiation penetrating the radiation sensitive layer may experience angle-scattering events such as forward scattering that may broaden a features dimensions and large angle back scattering that may cause a feature to receive radiation that has been scattered from other proximate features. A consequence of the proximity effect may be that small or isolated feature areas may receive a different radiation dose than larger features and more closely packed features. This may lead to subwavelength distortions, such as corner rounding in which sharp corners are rounded smooth and reduced in size, line shortening in which a length of a feature is reduced, closed contacts or holes, and similar distortions. Accordingly, the proximity effect may introduce unintended and undesirable structural distortions and inaccuracies into the exposure image.

The second mask 730 may include a pattern 740 to reduce a distortion due to the proximity effect. The pattern 740 may include an optical proximity correction (OPC) corresponding to the pattern 720. For example, the pattern 740 may include an OPC feature such as a serif to reduce corner rounding of a circuitry feature exposed by the pattern 720 by emphasizing or adding mass to a corner of the pattern 720, a hammerhead to reduce line shortening of a circuitry feature exposed by the pattern 720 by emphasizing an end of a line of the pattern 720, a sub-resolution scattering bar to assist a gate exposed by the pattern 720 by reducing radiation intensity, a gate bias to improve control of a dimensions exposed by the pattern 720 by correcting a gate pattern 720, and other modifying structural features.

Figure 1:
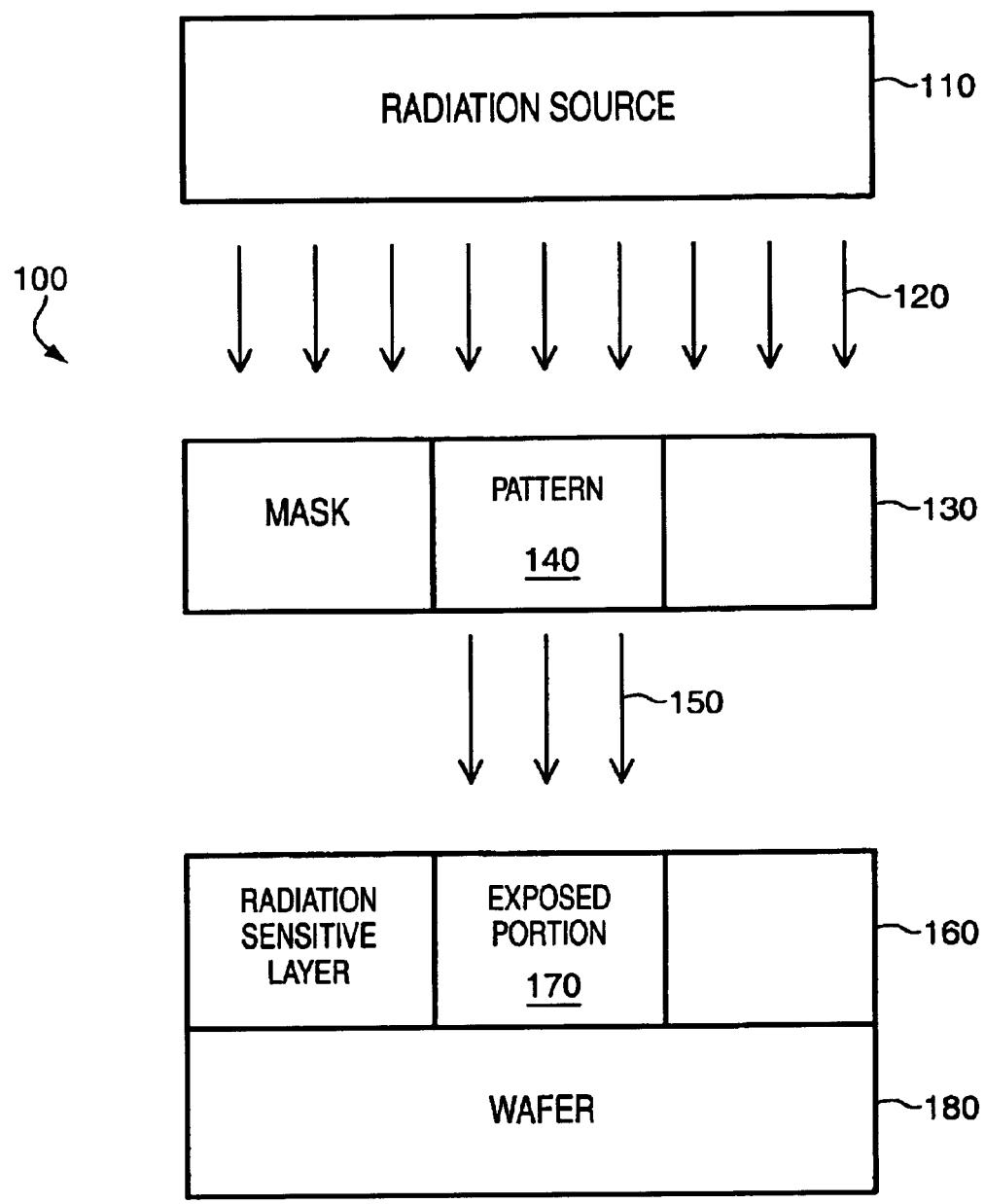
FIG. 1 shows typical components of a lithography system.
Figure 2:
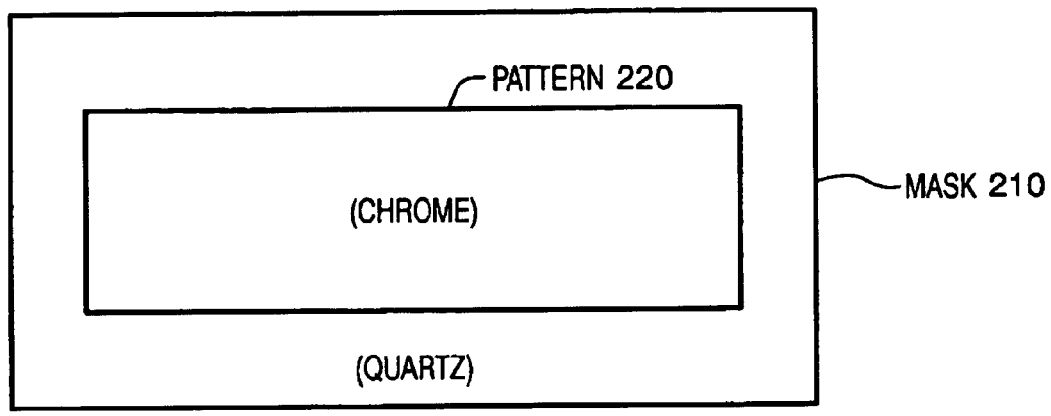
FIG. 2 shows a mask having a simple rectangle pattern.
Figure 3:
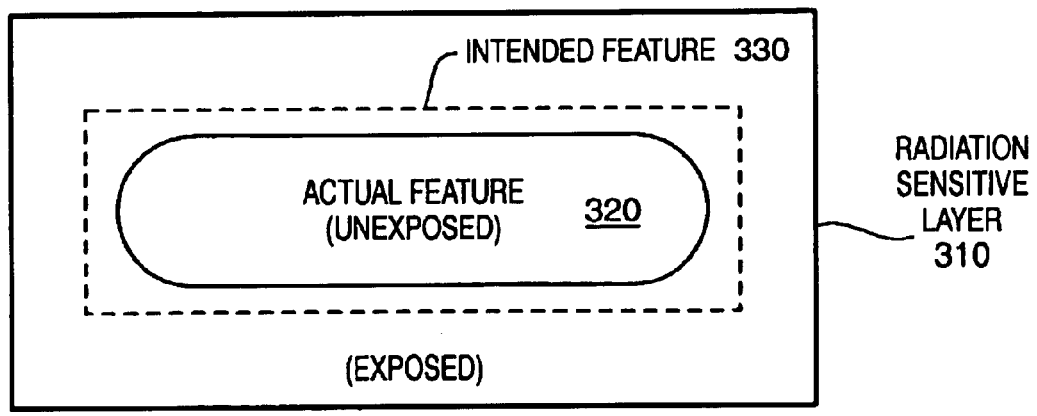
FIG. 3 shows a radiation sensitive layer having an exposed feature with a subwavelength distortion.
Figure 4:
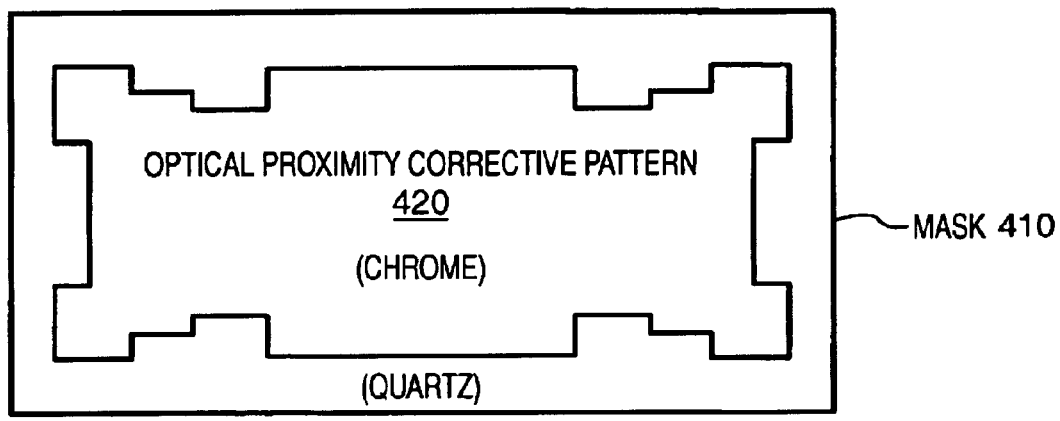
FIG. 4 shows a mask having an optical proximity error corrective pattern to reduce proximity effect distortions.
Figure 5:
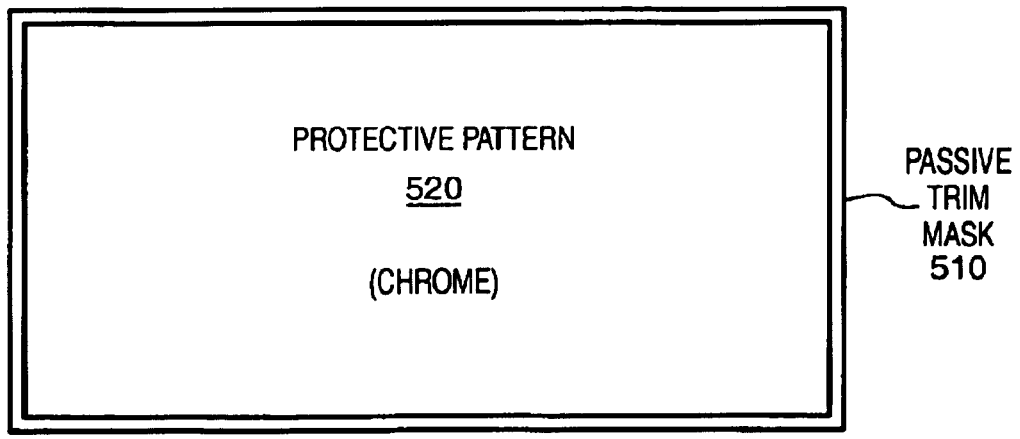
FIG. 5 shows a passive trim mask to protect a previous exposure image.

In this way, the second mask 730 and the second pattern 740 may perform subwavelength distortion reduction to an exposed pattern corresponding to the first mask 710 and the first pattern 720. Advantageously, it may be easier to design and fabricate a second mask that has these subwavelength distortion features than it would be to incorporate these features into a single first mask, as shown in the approach of FIG. 4. This may be particularly true when the feature sizes are very small.

Different approaches are contemplated to accomplish the modifying exposure, as will be discussed further below. Briefly, these approaches include binary patterns (transparent and opaque), a phase shifting patterns, halftone patterns, image balancing patterns (e.g., a low and high transmittance region pair reversed relative to a corresponding pair on a first mask), radiation intensity reducing patterns, subresolution feature patterns, and others. The following drawings illustrate particular combinations of a first mask and a second mask both having a potentially different approach from the above group. However, a person having an ordinary level of skill in the art and the benefit of the present disclosure will appreciate that other combinations are contemplated. For example, it is expected that a first mask having a pattern based on any of the above approaches could be modified by a second mask having a pattern based on any of the above approaches.

Figure 8:
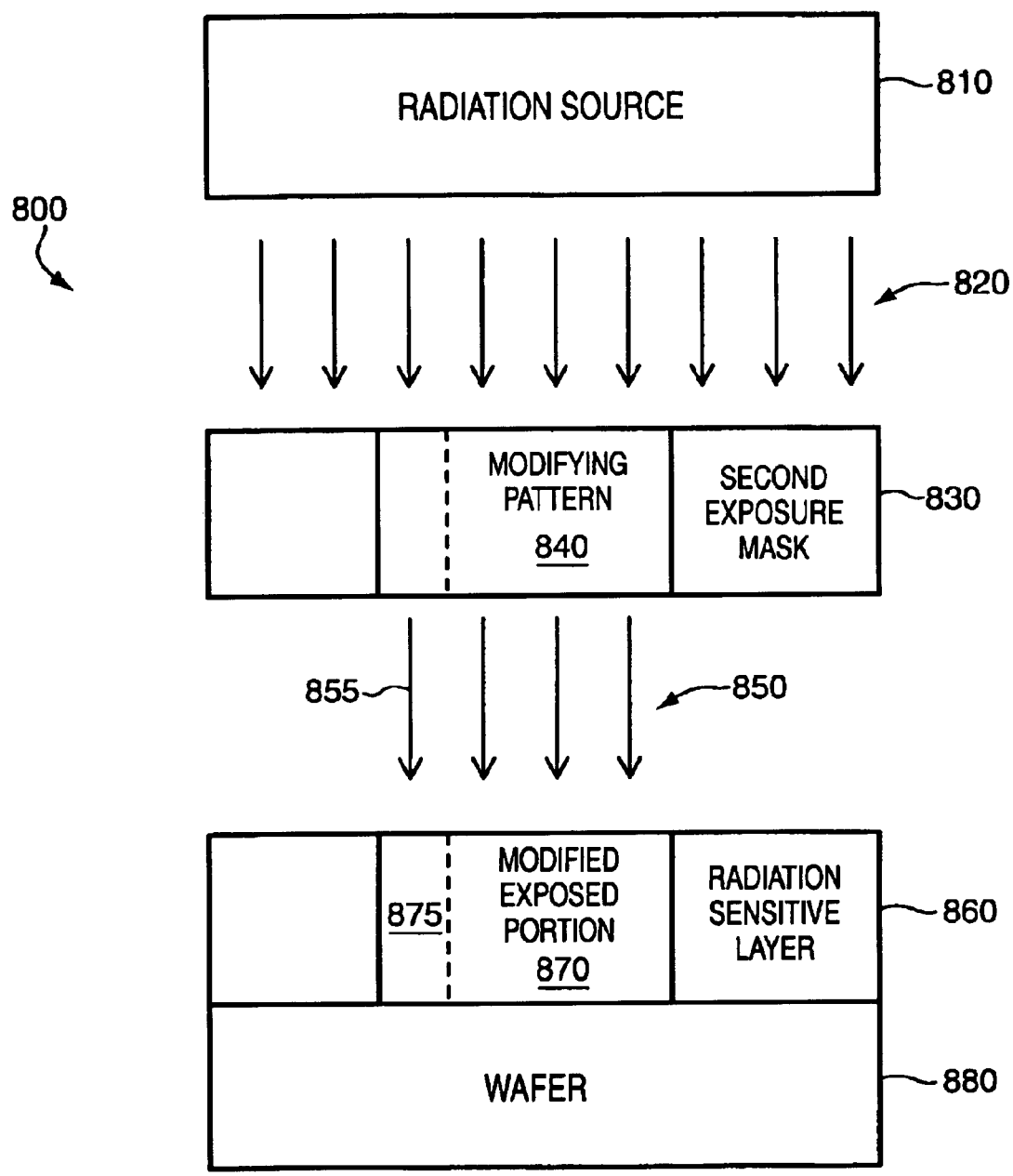
FIG. 8 shows a system to use a second mask to modify an exposure image corresponding to a first mask, according to one embodiment.

FIG. 8 conceptually illustrates exposing a layer to radiation via a second exposure mask. A radiation source 810 transmits radiation 820 towards a radiation sensitive layer 860, through a second exposure mask 830 that contains a modifying pattern 840. The modifying pattern may have a transparent portion corresponding to a region of the layer 860 proximate to or containing a previously exposed circuitry feature. The second exposure mask 830 and the modifying pattern 840 transmit radiation portion 850 including a modifying radiation 855 to the radiation sensitive layer 860. The radiations 850 and 855 modify an existing exposure in the radiation sensitive layer 860 to create the modified exposed portion 870 including a newly exposed portion 875 corresponding to the radiation 855. The invention is not limited to any particular radiation source 810, radiation 820, 850, radiation sensitive layer 860, wafer 880, equipment, exposure method, or type of subsequent processing.

Binary Second Exposure Mask

Figure 9:
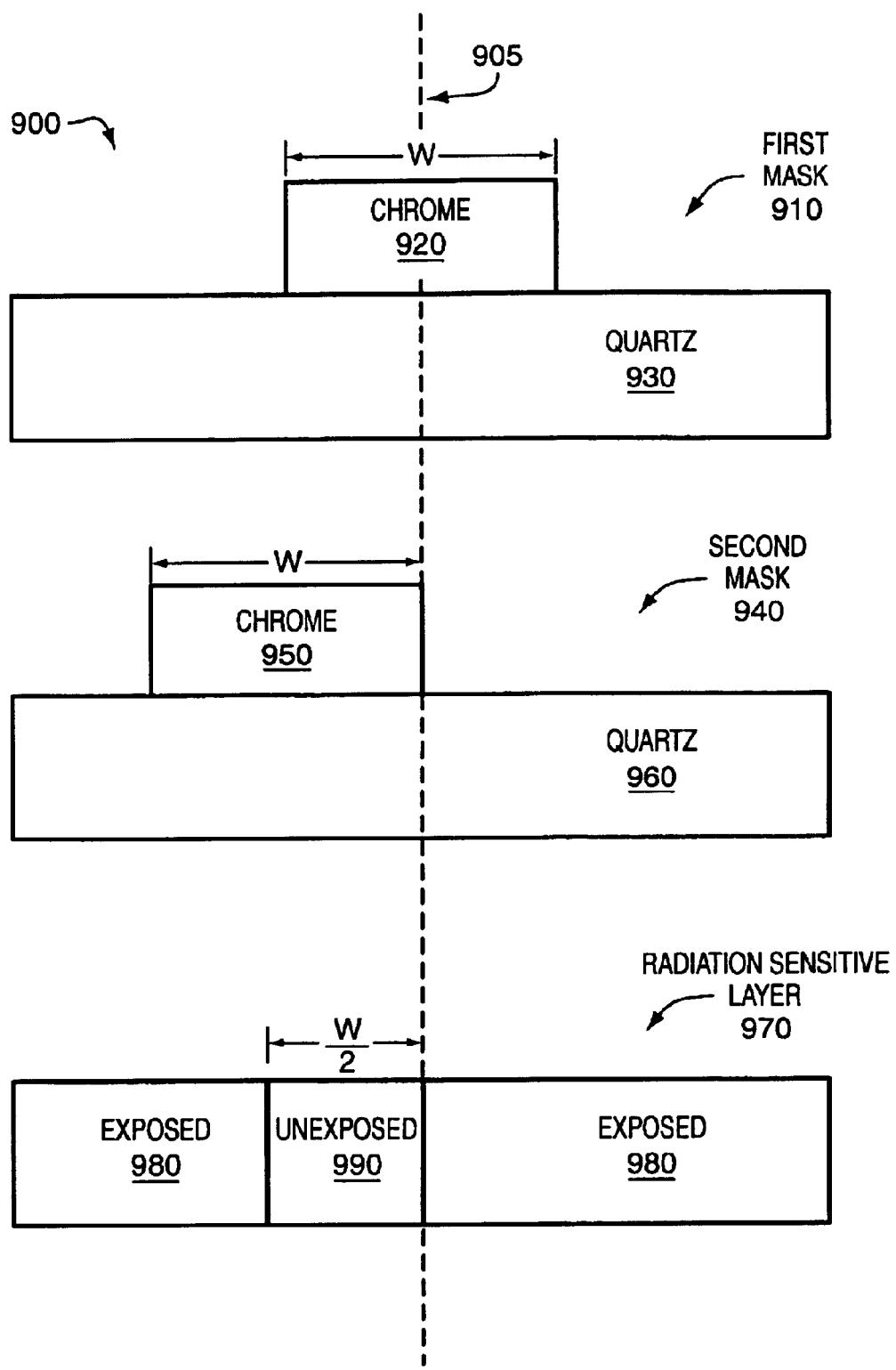
FIG. 9 shows a set of a first binary exposure mask to create a feature in a radiation sensitive layer and an active second binary exposure mask to reduce a dimension of the feature, according to one embodiment.

FIG. 9 shows a cross sectional view of set of binary masks 900 and a radiation sensitive layer 970 that was exposed by the set 900. A dashed line 905 is used to relate positions on the set of masks 900 to an exposure in the layer 970.

The set 900 includes a first binary mask 910 and a second binary mask 940. The first mask 910 has non-transparent chrome 920 on transparent quartz 930. The chrome 920 may correspond to a critical dimension of a circuitry feature, rather than a false edge that is not part of a circuitry feature. The dashed line 905 cuts through the center of the chrome 920. The second mask 940 includes chrome 950 on quartz 960. The dashed line 905 aligns with an edge of the chrome 950.

The radiation sensitive layer 970 has an exposure based on the first mask 910 and the second mask 940. In particular, the layer 970 includes exposed portions 980 and unexposed portion 990. The unexposed portion 990 is a combination of a first exposure due to the first mask 910 and a second modifying exposure due to the second mask 940. As shown by a location of the dashed line 905 relative to the unexposed portion 990, exposure to the second mask 940 modified and shrunk an unexposed region of the layer 970 that corresponds to a right hand half of the chrome 920 that lies to the right of the dashed line 905.

In the particular embodiment shown, each of the chromes 920 and 950 have a width w. Other widths are contemplated. Exposure to the first mask results in an exposure feature having a dimension that is substantially equal to w. Exposure to the second mask results in an exposure feature that is substantially equal to half of w. That is, in combination the first mask 910 and the second mask 940 may expose a feature 990 having a smaller dimension than is possible by either mask 910 or 940 acting alone. This may be advantageous in implementations wherein it is difficult or costly to make chrome 920 with a dimension less than w, but wherein an unexposed feature 990 having a dimension on the order of half w is desired. The unexposed feature 990 may correspond to a linewidth or some other critical dimension associated with a circuitry component.

Figure 10:
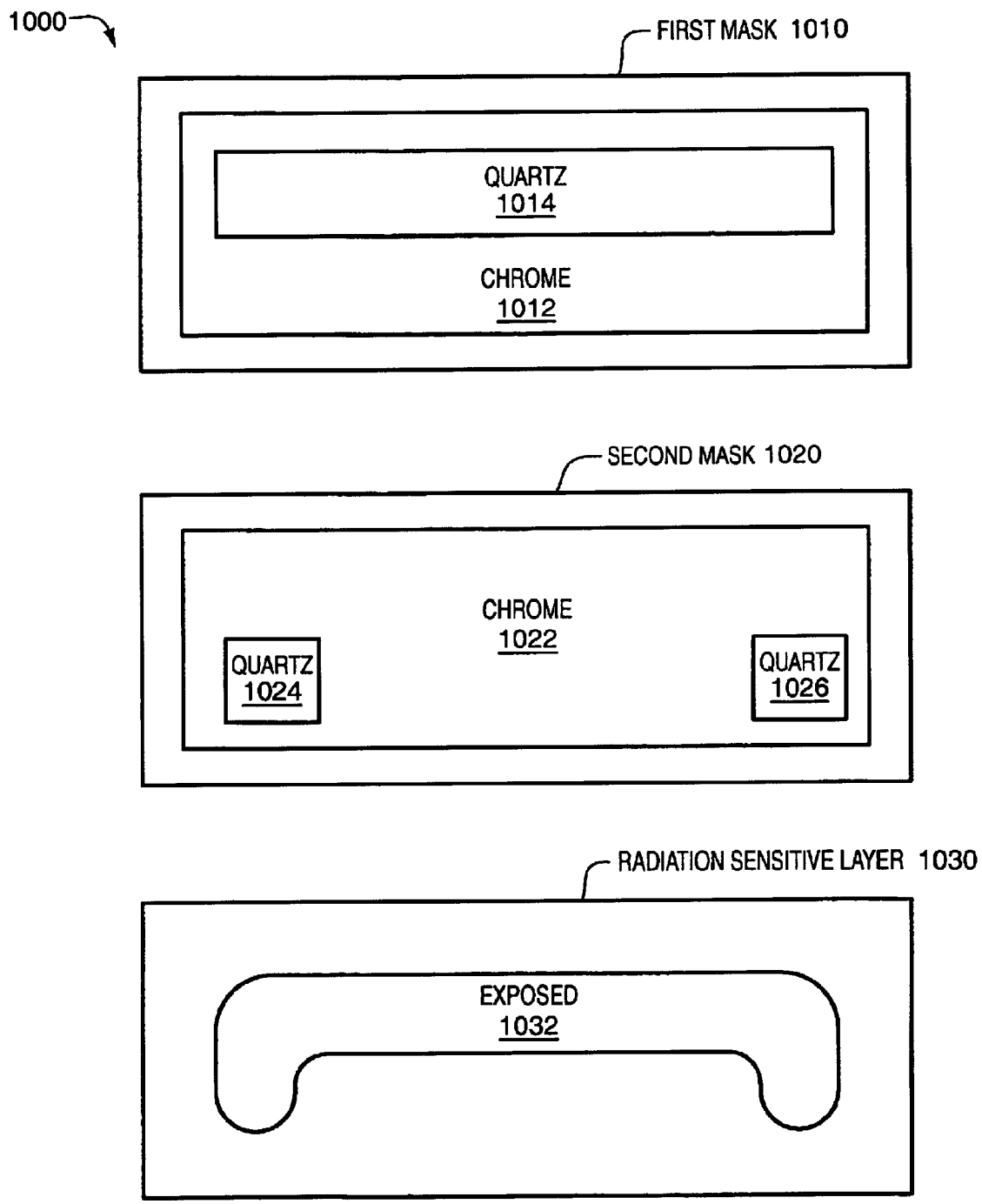
FIG. 10 shows a set of a first binary mask to create a feature in a radiation sensitive layer and an active second binary mask to add structural detail to the previous exposed feature, according to another embodiment.

FIG. 10 conceptually illustrates a set of binary masks 1000 and a radiation sensitive layer 1030 having an exposure based on the set 1000. The set 1000 includes a first mask 1010 and a second mask 1020. The first mask 1010 includes a region of chrome 1012 having a rectangular quartz feature 1014. The second mask 1020 has a region of chrome 1022 having a first rectangular quartz feature 1024 corresponding to a right hand end of the quartz 1014 and a second rectangular quartz feature 1026 corresponding to a left hand end of the quartz 1014.

The radiation sensitive layer 1030 has an exposed circuitry feature 1032 that results from a first approximation exposure from the first mask 1010 and a second refining exposure from the second mask 1020. The exposed feature 1032 combines exposure portions corresponding to the features 1014, 1024, and 1026. In this particular embodiment, the refining exposure adds structural features corresponding to the quartz features 1024, 1026 to an approximation feature corresponding to the quartz feature 1014. Advantageously, in this way a complex exposure feature 1032 can be constructed by combining comparatively simple features 1014, 1024, and 1026 in the first mask 1010 and the second mask 1020.

Phase Shifting/Binary Dual Exposure Masks

Figure 11:
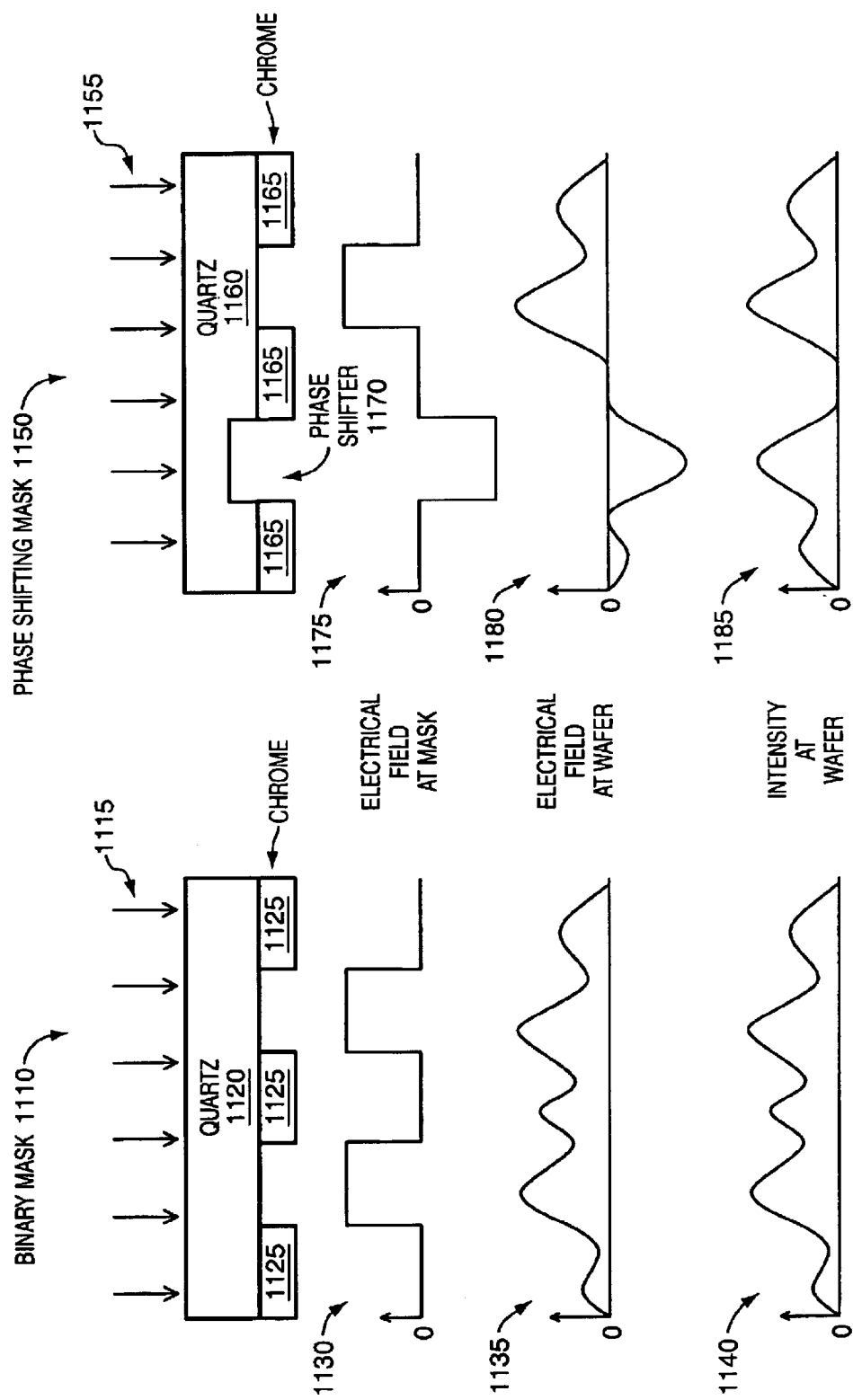
FIG. 11 shows operation of a binary mask and operation of a phase shifting mask, according to one embodiment.

FIG. 11 conceptually illustrates differences between a binary mask 1110 and a phase shifting mask 1150. Radiation 1115 is provided to the binary mask 1110 that includes quartz 1120 to transmit the radiation 1115 and chrome regions 1125 to block the radiation 1115.

Plots 1130, 1135, and 1140 are used to conceptually represent electrical field at the mask 1110, electrical field at the wafer, and radiation intensity at the wafer, resulting from the exposure to the binary mask 1110. The plot 1130 conceptually illustrates electrical field at the mask 1110 due to the radiation 1115. As shown, the electrical field may approximate a step function where near zero field corresponds to chrome regions 1125 and a higher electrical field occurs at gaps between the chrome 1125.

The plot 1135 conceptually illustrates electrical field at the wafer. As shown, the highest peaks in the plot 1135 correspond to the highest peaks in the plot 1130. There are also other unintended peaks due to the electromagnetic nature of the radiation 1115.

The plot 1140 conceptually illustrates intensity at the wafer and substantially corresponds in pattern to the plot 1135. Unfortunately, the unintended centrally located peak in the plot 1140 may reduce the resolution in the exposure of the intended features and cause pattern infidelity.

Radiation 1155 is provided to the phase shifting mask 1150. The mask 1150 has quartz 1160, chrome regions 1165, and a phase shifter 1170. As shown, the phase shifter 1170 may be an etched region of the mask 1150, however the phase shifter 1170 may also be a thickness of a material added to the mask 1150.

Plots 1175, 1180, and 1185 are used to conceptually represent electrical field at the mask 1150, electrical field at the wafer, and radiation intensity at the wafer, resulting from the exposure to the binary mask 1150. The plot 1175 conceptually illustrates electrical field at the mask 1150. As shown, the phase shifter 1170 may phase shift the electrical field relative to the electrical field for radiation transmitted without the shifter 1170. In the particular case shown, the shifter 1170 shifts the radiation and the electrical field by 180 degrees. The plot 1180 conceptually represents electrical field at the wafer and shows a potentially beneficial effect of the phase shifter 1170 that the centrally located peak shown in plot 1135 has been reduced or essentially eliminated. Plot 1185 shows that the same reduction is present in the intensity at the wafer. Advantageously, in this way the phase shifter 1170 may improve resolution and reduce unintended exposure.

Figure 12:
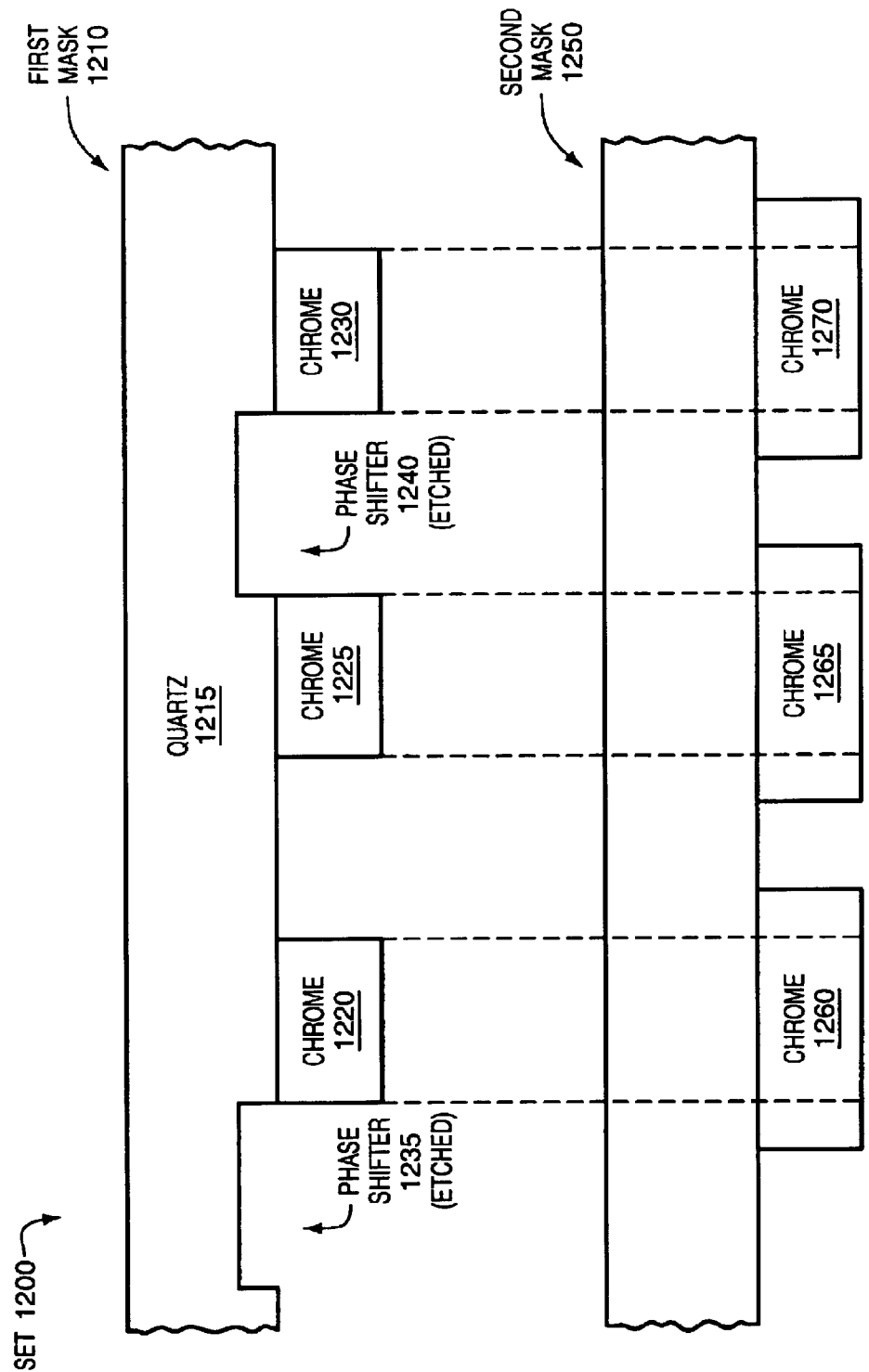
FIG. 12 shows a set of a first phase shifting mask to create an exposed feature and a second binary mask to modify the exposed feature, according to one embodiment.

FIG. 12 conceptually illustrates a set 1200 of a first phase shifting mask 1210 and a second binary mask 1250. The first phase shifting mask 1210 includes quartz 1215, chrome regions 1220, 1225, and 1230, and a first and second etched quartz phase shifter 1235, 1240 to improve exposure resolution. The phase shifters 1235 and 1240 may each shift radiation by 180 degrees, or else by another amount such as by 45, 60, 90, 120, or 270 degrees.

The chrome 1220 has the first phase shifter 1235 on its left hand side and no phase shifter on its right hand side. Shifted radiation passing through the phase shifter 1235 may become out of phase with respect to unshifted radiation passing through the gap to the immediate right of chrome 1220, which has no phase shifter, and the shifted radiation may destructively interfere with the unshifted radiation causing the electric field vector to approach zero at the center of the chrome 1220. Advantageously, this may increase the sharpness with which chrome 1220 is printed on the radiation sensitive layer and may permit smaller linewidth chrome 1220 to print on the radiation sensitive layer.

The second mask 1250 includes quartz 1255 and chromes 1260, 1265, and 1270. Exposure to the mask 1250 modifies an exposure to the mask 1210. The chromes 1260, 1265, and 1270 overlap chromes 1220–1230 sufficiently to reduce the linewidth previously printed by the mask 1210. The second mask 1250 may also contain binary features to define exposure features in binary format in a way that would be difficult to incorporate into the first mask 1210 due to the phase shifting.

According to one embodiment, the first mask 1210 may be purely chromeless and lack the chromes 1220–1230 and expose a linewidth based only on the phase shifter 1235. In such a chromeless mask it may be difficult to provide subwavelength distortion reduction and optical proximity correction due to the low mask error factor of the phase shift mask 1210. Accordingly, it may be desirable and easier to perform such modifications in the second mask 1250 in binary rather than phase shifting format.

Figure 13:
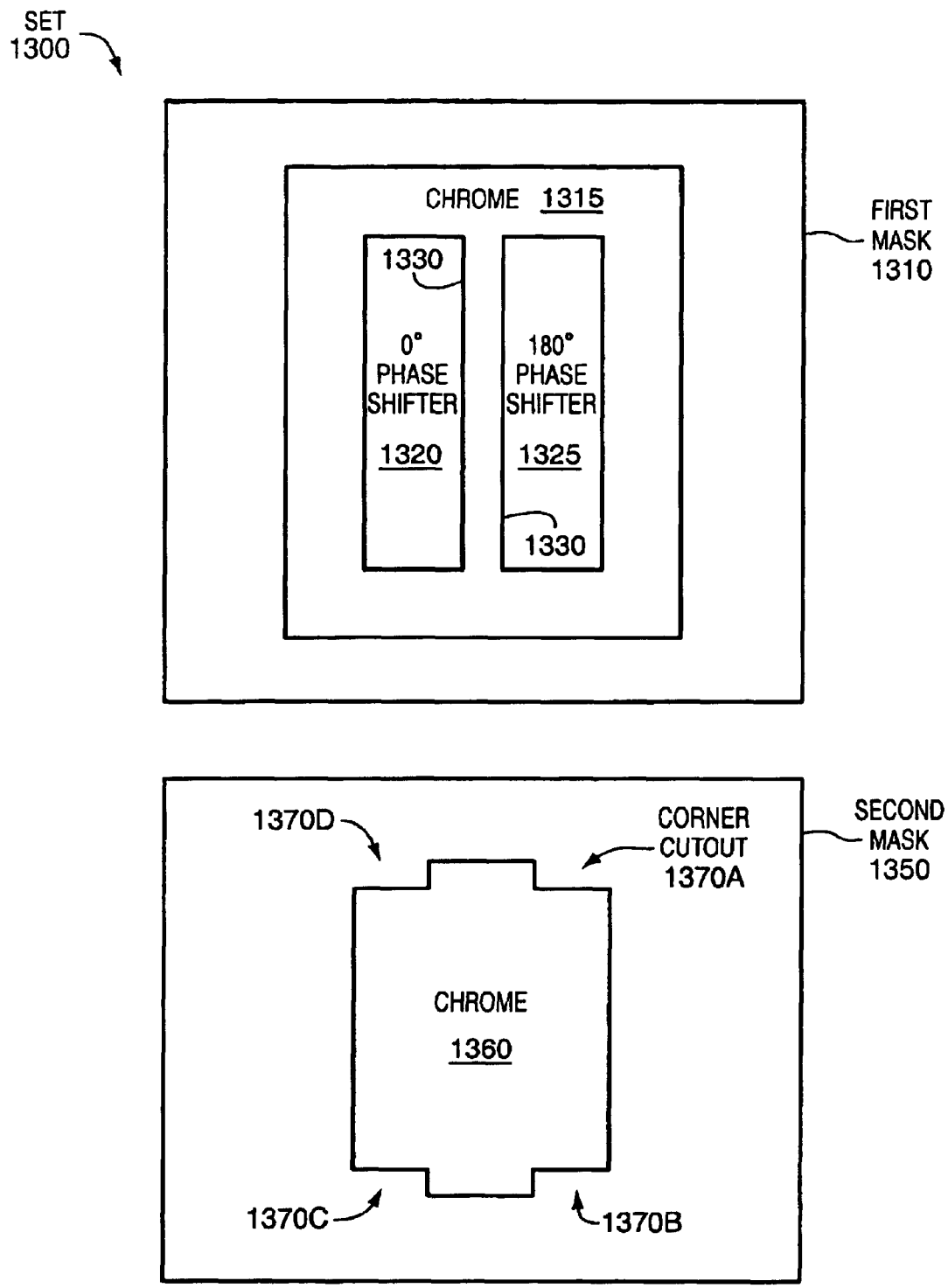
FIG. 13 shows a set of a first phase shifting mask to expose a feature and a second active binary exposure mask having corner cutouts to reduce corner rounding distortions of the exposed feature, according to one embodiment.

FIG. 13 conceptually illustrates a set 1300 of a first phase shifting mask 1310 and a second binary mask 1350. The first phase shifting mask 1310 includes chrome 1315, a 0° phase shifter 1320, a 180° phase shifter 1325, and a chrome linewidth 1330. The linewidth 1330 and the phase shifters 1320, 1325 form an active phase shifting region to expose a linewidth. The phase shifters 1320, 1325 pass exposure radiation and the linewidth 1330 blocks some radiation.

The active phase shifting region may expose a linewidth in a radiation sensitive layer. Such a linewidth may be used to create a desired transistor gate exposure feature having both inactive regions at the top and bottom of the linewidth and an active region that is centrally located on the linewidth 1330. However, the approximation may differ from the desired transistor gate due to subwavelength distortions. In particular, the actually exposed feature may have regions in the inactive regions at the top and bottom of the linewidth 1330 that are corner rounded rather than sharp corners due to proximity error.

The second exposure mask 1350 may modify the approximation and reduce these subwavelength corner rounding distortions so that the final exposed gate feature more closely resembles the desired gate feature. The second mask 1350 has an opaque chrome structure 1360 corresponding to the linewidth 1330 to protect the exposed linewidth and having a plurality of at least partially transparent corner cutouts 1370A, 1370B, 1370C, and 1370D. The chrome structure 1360 may have a height and a width that are less than a width and a height of the active phase shifting region (the shifters 1320, 1325 and the linewidth 1330) to allow trimming unexposed regions along the top bottom and left hand side of the phase shifter 1320 and along the top bottom and right hand side of the phase shifter 1325. That is, the binary features of the second mask 1350 do not completely protect a corresponding phase aperture region made up of 1320 and 1325 from exposing radiation during the second exposure.

The plurality of transparent corner cutouts 1370A, 1370B, 1370C, and 1370D are positioned to correspond to the corner rounded regions at the top and bottom of the linewidth 1330 to reduce the corner rounded regions by transmitting modifying radiation to the corner rounded regions. Desirably, the cutouts 1370A–D allow sufficient radiation to pass to the previous exposure to modify and reduce the corner rounded regions at the top and bottom of the linewidth 1330 without allowing too much radiation to pinch the unexposed regions at the top and bottom of the linewidth 1330 or cause line shortening of the linewidth 1330.

The cutouts 1370A–D may have a number of common shapes such as rectangles, squares, triangles, circles, ellipses, and others. The cutouts 1370A–D may also have random shapes. The cutouts 1370A–D may have an elongated shape such as a rectangle that has a longest axis that is perpendicular to the linewidth 1330 to provide comparatively more radiation along the top or alternatively the bottom edge of the previous exposure.

The corner cutouts may in combination essentially remove a small percentage of an otherwise regular rectangular chrome structure. The small percentage may be determined such that the cutouts 1370A–D pass enough radiation to the previous exposure to reduce the corner rounded regions but do not pass so much radiation to the previous exposure to overly shrink or pinch the top and bottom ends corner rounded regions corresponding to the top and bottom of the linewidth 1330 or cause line shortening. The small percentage may be less than about 5% or preferably between about 1% and 2%.

Advantageously, in this way, the second mask 1350 may modify and reduce corner rounding proximity effect distortions that are introduced by the first mask 1310 by passing modifying radiation to a previous exposure to reduce the distortions. Other embodiments are contemplated, such as embodiments to reduce feature bias error or line end shortening distortions.

Pattern Shift Distortion And Correction

Figure 14:
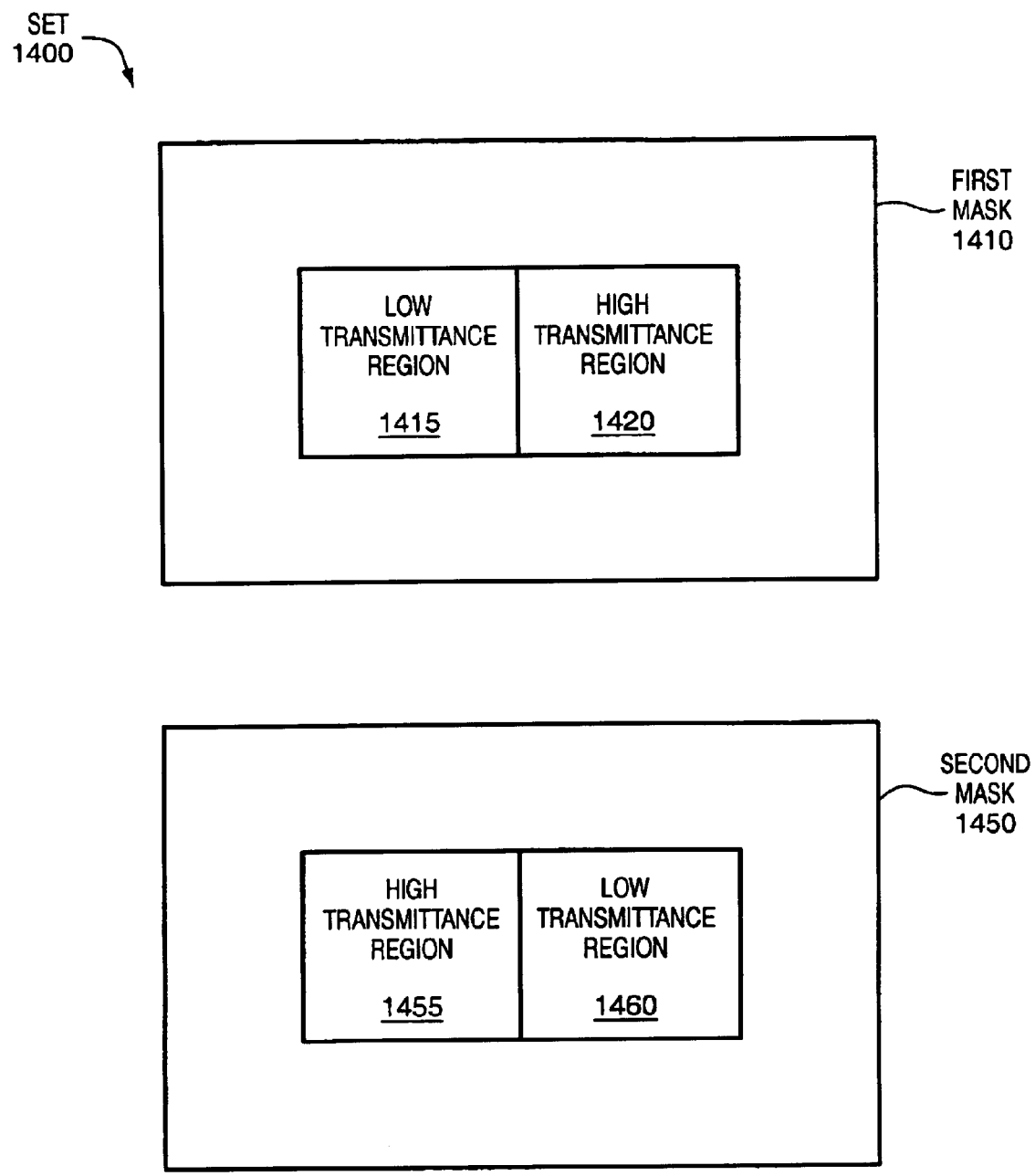
FIG. 14 shows a first mask to expose a feature and a second active mask to reduce a pattern shifting distortion in the exposed feature, according to one embodiment.

FIG. 14 conceptually illustrates a set of masks 1400 including a first mask 1410 that introduces a distortion and a second mask 1450 to reduce the distortion. The first mask 1410 includes a low transmittance region 1415 to transmit comparatively low intensity radiation to the radiation sensitive layer and a high transmittance region 1420 to transmit comparatively high intensity radiation to the radiation sensitive layer. The difference in transmission of radiation between the low transmittance region 1415 and the high transmittance region 1420 may lead to unintended pattern shifts in the image on the wafer. An exposure image based on the first mask 1410 may contain a distorted linewidth that is shifted toward the low transmittance shifter 1415 due to the shifter 1420 providing a greater transmittance of radiation compared with the shifter 1415 or to an effective phase difference between shifters that differs from a multiple of 180°.

These pattern shift distortions may be taken into account during design of the first mask 1410, although at great design expense and complexity taking into consideration factors such as feature edge bias, dual trench etch, wet etch undercut, and sidewall chrome absorber. Additionally, this approach may only reduce the pattern shift for a limited pitch range on the first mask.

An alternate approach is to use a second mask 1450 having a high transmittance region 1455 that corresponds to the region 1415 and a low transmittance region 1460 that corresponds to the region 1420. That is, the low 1455 and high transmittance region 1460 of the second mask 1450 are reversed relative to the low 1415 and high transmittance region 1420 of the first mask 1410. This reversal may reduce, or partially compensate the pattern shift distortion introduced into the linewidth by the first mask 1410 due to the transmission difference between the regions 1415 and 1420. Accordingly, an image portion of a radiation sensitive layer that is exposed to the first mask 1410 and the second mask 1450 is first exposed to reduced radiation by the low transmittance region 1415 and then subsequently exposed to comparatively more radiation by the high transmittance region 1455. Advantageously, in this way the second mask 1450 may modify an exposure image of the first mask 1410 to reduce an unintended pattern shift distortion. This approach may be significantly simpler than accounting for the pattern shift distortion during design of the first mask 1410. Another advantage of this approach is the ability to reduce linewidth by pattern shifting a linewidth toward the low transmittance region 1415 during the first exposure and then pattern shifting toward the low transmittance region 1460 during the second exposure. This may effectively reduce the linewidth in the exposure image. Other modifications are also contemplated. For example, this sort of linewidth reduction may be used to exert corner rounding reduction exposures at each of a top and bottom end of a gate linewidth, such as shown in the linewidth 1330, without substantial reduction in the middle active region 1340.

The regions 1415, 1420, 1455, and 1460 may be any type of regions desired for the particular implementation to either provide low or high transmittance. According to a first embodiment, the low transmittance regions 1415 and 1455 have a radiation intensity reducer to reduce a portion of the received incident radiation, but sufficiently less than all, so that the reduced portion does not expose the radiation sensitive layer. The reducer may reduce by reflecting, blocking, diffusing, scattering, absorbing, or otherwise reducing. Different radiation intensity reducers are contemplated. According to a second embodiment a radiation intensity reducer comprises added topographical thickness of material compared to that in the high transmittance regions 1420 and 1460, wherein the added thickness of material reduces the radiation. For example, the low transmittance regions 1415 and 1455 may include an added thickness of material that reduces radiation in proportion to the thickness of material through which the radiation is transmitted due to scattering. This may be the case of a region having material added thereon to perform phase shifting. This may also be the case in a phase shifter relative to another phase shifter having a dark pit etched quartz used for a 180° phase shifter. The pit etching, especially in the sidewall region, may lead to a transmission difference between the region 1415 and 1420 that is not a multiple of 180°. Other embodiments of a radiation intensity reducer will be discussed below.

Radiation Intensity Reducing Second Exposure Masks

Figure 15:
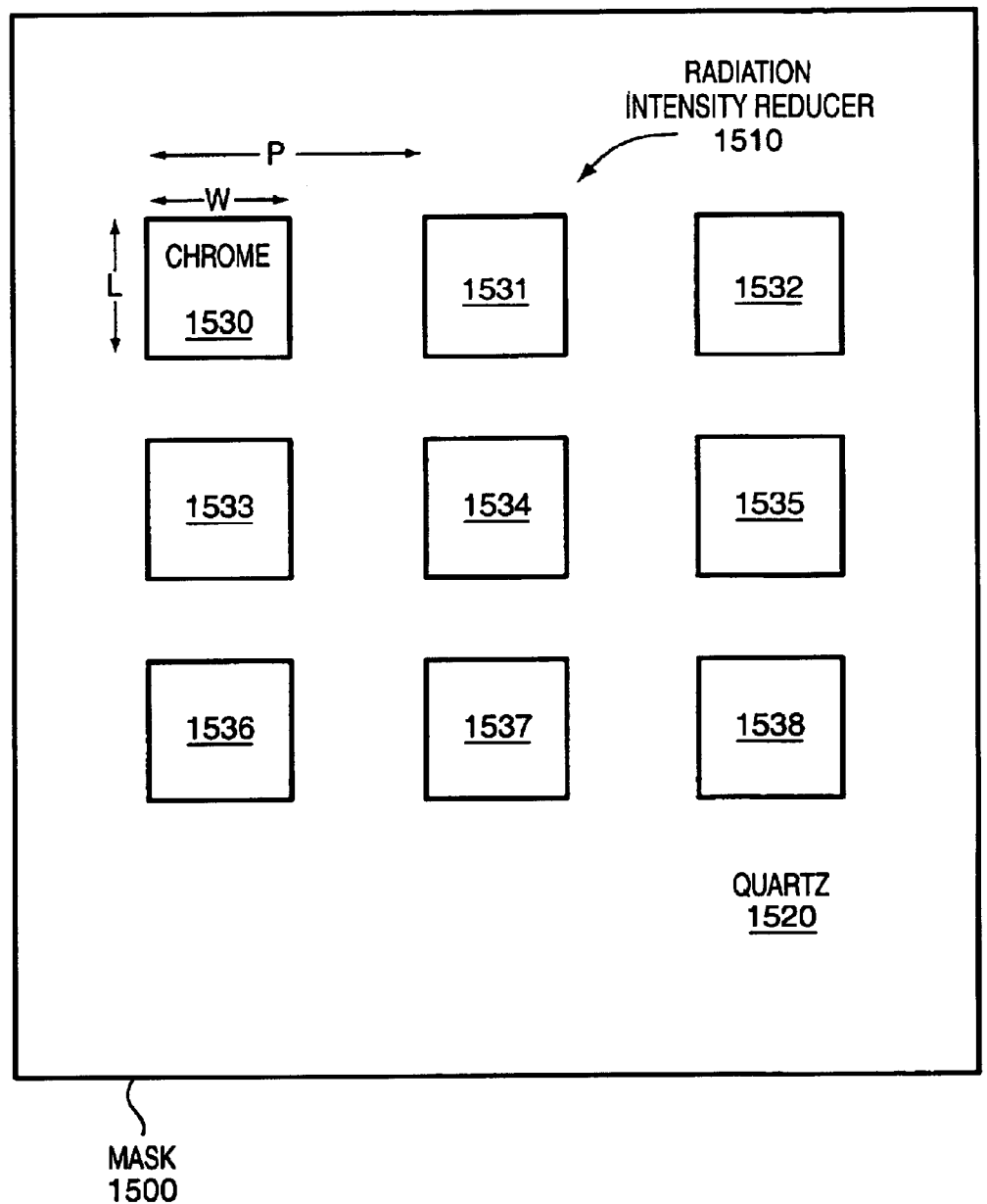
FIG. 15 shows a second active exposure mask having a radiation intensity reducer, according to one embodiment.

FIG. 15 shows a second exposure mask 1500 having a radiation intensity reducer 1510 to reduce an intensity of radiation exposing a radiation sensitive layer. The radiation intensity reducer 1510 may allow partial exposure to typically a subset of a previous exposure image that may benefit from a modification including an additional reduced dose of radiation exposure.

The radiation intensity reducer 1510 may correspond to a subwavelength distortion region of a circuitry feature in an exposure image from a first mask. For example, the reducer 1510 may correspond to a corner rounded region of a gate circuitry feature in an exposure image resulting from an exposure to a first mask. In this case, the reducer 1510 may provide radiation exposure to the corner rounded region to modify the exposure image and reduce the corner rounding distortion. Alternatively, the radiation intensity reducer 1510 may correspond to a top and bottom line shortened region of a line circuitry feature in an exposure image resulting from a first exposure using a first mask. In this case, the reducer 1510 may provide radiation exposure to the line shortened regions of the line circuitry feature to modify the exposure image and reduce the line shortening distortion. Other modifications with the reducer 1510 are also contemplated.

As shown, the reducer 1510 may have a plurality of features 1530–1538. The features 1530–1538 may be rectangles, squares, circles, lines, and other shapes, combinations of shapes, or irregularly shaped features. The features 1530–1538 may have an organized arrangement (e.g., a grid) or may be randomly placed. The features 1530–1538 may be opaque or at least partially opaque. The features 1530–1538 may be subresolution features that prevent a portion of the radiation transmitted to the mask 1500 from exposing the radiation sensitive layer but which do not impart image information into the exposure image. Diffraction around the subresolution features 1530–1538 may ensure that this happens provided they are sufficiently small.

Consider a specific example. The features 1530–1738 may be chrome squares having a size and spacing arrangement that is designed to provide a predetermined modifying exposure. The features may have a substantially consistent and predetermined length (L), width (W), and spacing factor (P), as shown in FIG. 15. The dimensions L and W may be small enough that the features are not printed on the wafer due to diffraction and the number of such features per unit area on the mask may be determined to achieve a desired and predetermined modifying exposure. For example, as a first approximation the following relationships may be used to size and arrange the features 1530–1538:

$$P < \frac{Wavelength}{Numerical\ Aperture(1+\sigma)}$$

$$f_c = \sqrt{\frac{Transmitted\ Intensity}{Incident\ Intensity}}$$

$$f_d = 1 - f_c$$

$$L = W = p\sqrt{f_d}$$

where P is selected to satisfy the condition of the first equation at 1X, σ is the partial coherence factor also known as a condensor/objective fill factor, and $f_c$ is a clear fraction that is set based on the predetermined desired exposure. However, this approach makes certain simplifications and assumptions including that simple scalar thin-mask theory applies, that certain optical properties and thickness may be disregarded, and other assumptions. The applicability of these relationships should be evaluated for relevancy to the particular implementation. Of course more sophisticated relationships may be employed when desired.

Another embodiment is contemplated wherein the reducer 1510 may include a material or substance that provides partial transmittance of incident radiation. The partial transmittance may be substantially less compared to quartz to reduce at least about twice as much incident radiation as quartz per unit thickness. For example, the reducer 1510 may include a layer or film that provides partial transmittance of incident radiation and that may also perform phase shifting. For example, the film may include an amount of molybdenum silicide (MoSi) or chromium fluoride (CrF) sufficient to provide the desired radiation intensity reduction. These materials are available from a number of vendors in the semiconductor manufacturing industry, as will be appreciated by a person having an ordinary level of skill in the art and the benefit of the present disclosure. In such an embodiment, the radiation reduction may depend on a number of factors including layer thickness, material properties, composition, and other factors.

Mask Data in Machine-Readable Format

A computer program product comprising a machine-readable medium may have stored thereon data and/or data structures related to the invention in a machine-readable format. The machine-readable medium may include, but is not limited to, floppy diskettes, optical disks, CD-ROMs, and magneto-optical disks, magnetic tape, ROMs, RAMs, EPROMs, EEPROMs, magnet or optical cards, flash memory, or other type of media or machine-readable medium suitable for storing electronic instructions and data. Moreover, the present invention may also be downloaded as a computer program product, wherein the program may be transferred from a remote computer to a requesting computer by way of data signals embodied in a carrier wave or other propagation medium via a communication link (e.g., a modem or network connection).

For example, according to one embodiment, data and/or data structures representing a mask may be provided in a machine-readable format and via a machine-readable medium. The data and/or data structures may be used by computer systems and applications to simulate, analyze, optimize, and otherwise examine the data and/or data structures. The data and/or data structures may also be used in a computer implemented process that includes instructions to manufacture based on the data and/or data structures to manufacture a mask, manufacture a semiconductor device, or both manufacture a mask and a semiconductor device.

Computer Systems

Computer systems may be used with certain embodiments. As discussed herein, a "computer system" may be an apparatus including hardware and/or software for processing data. The computer system may include, but is not limited to, a computer (e.g., portable, laptop, desktop, server, mainframe, etc.), computerized or controlled manufacturing equipment, and the like. According to one embodiment, a computer system may be used to model, simulate, or design a mask having circuitry patterns and/or modifying circuitry patterns for semiconductor devices or integrated circuits based on the disclosed systems and methods. For example, method 600 may be used to model, simulate, or design a first and second exposure mask. In one embodiment, a mask may be modeled, simulated, or designed by removing portions of a completely protective trim mask in judicious amounts until a targeted pattern is obtained. According to another embodiment, a computer system may be used to operate mask fabrication equipment to fabricate a mask based on instructions and/or data representing the mask. According to still another embodiment, a computer system may be used to operate semiconductor device manufacturing equipment based on a mask as shown and described herein.

In conclusion, the present invention provides a second patterned mask to modify an exposure image created by a previous exposure. This mask may be used to manufacture integrated circuits.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A set of masks comprising:
   a first mask having a first pair of low and high transmittance phase shifting regions; and
   a second mask having a second pair of low and high transmittance phase shifting regions, wherein the second pair is reversed relative to the first pair and a high transmittance phase shifting region of the second pair corresponds to a low transmittance phase shifting region of the first pair.

2. The set of mask of claim 1, wherein the first pair is to expose a line, and wherein the second pair is to of reduce a width of the line.

3. The set of mask of claim 1, wherein at least one low transmittance phase shifting region of the first and second pairs comprises an arrangement of opaque subresolution shapes.

4. The set of masks of claim 3, wherein at least one low transmittance phase shifting region of the first and second pairs of comprises a grid of opaque subresolution shapes.

5. The set of mask of claim 1, wherein at least one low transmittance phase shifting regionof the first and second pairs comprises a layer or film that provides partial transmittance.

6. The set of masks of claim 5, wherein the layer or film includes at least one of the molybdenum silicide and chromium fluoride.

7. The set of masks of claim 1, further comprising:
a portion of the first mask to expose a featur in the radiation sensitive layer; and
a portion of the second mask to add a structural feature to the exposed feature.

8. The set of masks of claim 1, further comprising:
a portion of the first mask to expose a feature in the radiation sensitive layer; and
a radiation intensity reducer of the second mask to reduce a subwavelength distortion of the exposed feature.

9. The set of masks of claim 1, comprising:
a first opaque line of the first mask to expose a line having a width in the radiation sensitive layer; and
a second opaque line of the second mask to reduce the width of the exposed line.

10. A set of masks comprising:
a first mask having a first low transmittane region to transmit comparatively low intensity radiation to a radiation sensitive layer and a first high transmittance region to transmit comparatively high intensity radiation to the radiation sensitive layer; and
a second mask having a second high transmittance region that corresponds to the first low transmittance region and a second low transmittance region that corresponds to the first high transmittance region.

11. The set of mask of claim 10, wherein each of the low and high transmittance regions are phase shifting regions, and wherein the low and high transmittance phase shifting regions of the first mask are reversed relative to the low and high transmittance phase shifting regions of the second mask.

12. The set of masks of claim 10, wherein at least one of the low transmittance regions comprises an arrangement of opaque subresolution shapes.

13. The set of masks of claim 12, wherein the arrangement comprises a grid of opaque subresolution shapes.

14. The set of masks of claim 10, wherein at least one of the low transmittance regions comprises a layer of film that provides partial transmittance.

15. The set of masks of claim 14, wherein the layer or film includes at least one of the molybdenum silicide and chromium fluoride.

16. The set of masks of claim 10, wherein the first low and high transmittane regions are to expose a linewidth, and wherein the second low and high transmittance regions are to reduce a width of the linewidth.

17. The set of masks of claim 10, further comprising:
a portion of the first mask to expose a feature in the radiation sensitive layer; and
a portion of the second mask to add a structural feature to the feature.

18. The set of masks of claim 10, further comprising:
a portion of the first mask to expose a feature in the radiation sensitive layer; and
a radiation intensity reducer of the second mask to reduce a subwavelength distortion of the feature.

19. The set of masks of claim 10, further comprising:
a first opaque line of the first mask to expose a line having a width in the radiation sensitive layer; and
a second opaque line of the second mask to reduce the width of the line.

* * * * *

UNITED STATES PATENT AND TRADEMARK OFFICE
CERTIFICATE OF CORRECTION

PATENT NO.         : 7,014,956 B2                                              Page 1 of 1
APPLICATION NO.    : 10/040772
DATED              : March 21, 2006
INVENTOR(S)        : Chen et al.

It is certified that error appears in the above-identified patent and that said Letters Patent is hereby corrected as shown below:

In column 15, at line 12, delete "featur" and insert --feature--.

In column 15, at line 28, delete "transmittane" and insert --transmittance--.

In column 16, at line 11, delete "of" and insert --or--.

In column 16, at line 18, delete "transmittane" and insert --transmittance--.

Signed and Sealed this

Twenty-fourth Day of March, 2009

JOHN DOLL
*Acting Director of the United States Patent and Trademark Office*